(12) United States Patent
Matsunami et al.

(10) Patent No.: US 8,934,309 B2
(45) Date of Patent: Jan. 13, 2015

(54) SEMICONDUCTOR INTEGRATED CIRCUIT AND SEMICONDUCTOR PHYSICAL QUANTITY SENSOR DEVICE

(71) Applicant: Fuji Electric Co., Ltd., Kawasaki-shi (JP)

(72) Inventors: Kazuhiro Matsunami, Matsumoto (JP); Mutsuo Nishikawa, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 13/941,001

(22) Filed: Jul. 12, 2013

(65) Prior Publication Data
US 2013/0294171 A1   Nov. 7, 2013

Related U.S. Application Data

(63) Continuation of application No. PCT/JP2012/055005, filed on Feb. 28, 2012.

(30) Foreign Application Priority Data

Feb. 28, 2011   (JP) .................................. 2011-042002

(51) Int. Cl.
*G11C 7/00*        (2006.01)
*G11C 11/34*       (2006.01)
(Continued)

(52) U.S. Cl.
CPC ............... *G11C 16/102* (2013.01); *G11C 16/12* (2013.01); *G11C 16/30* (2013.01); *G11C 16/10* (2013.01); *G11C 2216/30* (2013.01)
USPC ........................ 365/191; 365/185.18; 365/221

(58) Field of Classification Search
CPC ........ G11C 16/10; G11C 16/12; G11C 16/30; G11C 16/0483; G11C 11/4091; G11C 7/065; G11C 7/06; G11C 5/14; G11C 5/147; H01L 27/115

USPC ..................... 365/185.18, 227, 205, 191, 221
See application file for complete search history.

(56) References Cited

U.S. PATENT DOCUMENTS 5,175,704 A * 12/1992 Minagawa et al. ...... 365/185.05
5,461,584 A    10/1995 Ikuta et al.
(Continued)

FOREIGN PATENT DOCUMENTS

JP    06-029555 A    2/1994
JP    08-029269 A    2/1996
(Continued)

*Primary Examiner* — Richard Elms
*Assistant Examiner* — Ajay Ojha
(74) *Attorney, Agent, or Firm* — Rossi, Kimms & McDowell LLP

(57) ABSTRACT

In aspects of the invention, an auxiliary memory circuit includes a shift register wherein a plurality of flip-flops are cascade-connected and a plurality of inversion circuits that invert and output outputs of each D flip-flop. A main memory circuit includes a switch, which acts in accordance with a signal from the auxiliary memory circuit, and an EPROM connected in series to the switch and driven by a writing voltage. A variable resistance circuit includes a switch, which acts in accordance with a signal from the auxiliary memory circuit, and a resistor connected in series to the switch. With aspects of the invention, it is possible for terminals of the writing voltage and a writing voltage to be commonized. Also, it is possible to provide a low-cost semiconductor physical quantity sensor device that can carry out electrical trimming with the voltage when writing into the EPROM kept constant.

6 Claims, 10 Drawing Sheets

(51) Int. Cl.
*G11C 16/10* (2006.01)
*G11C 16/12* (2006.01)
*G11C 16/30* (2006.01)

(56) References Cited

U.S. PATENT DOCUMENTS

| | | | |
|---|---|---|---|
| 6,006,169 A * | 12/1999 | Sandhu et al. | 702/132 |
| 7,180,798 B2 * | 2/2007 | Nishikawa et al. | 365/191 |
| 2001/0017567 A1 | 8/2001 | Kawakubo | |
| 2002/0048193 A1 | 4/2002 | Tanikawa et al. | |
| 2004/0027872 A1 | 2/2004 | Nishikawa et al. | |
| 2006/0147061 A1 | 7/2006 | Niwa et al. | |
| 2009/0189226 A1 | 7/2009 | Yamamoto et al. | |

FOREIGN PATENT DOCUMENTS

| | | |
|---|---|---|
| JP | 3068540 B2 | 5/2000 |
| JP | 2000-194431 A | 7/2000 |
| JP | 2001-242949 A | 9/2001 |
| JP | 2002-133878 A | 5/2002 |
| JP | 2003-302301 A | 10/2003 |
| JP | 3480389 B2 | 10/2003 |
| JP | 2006-191359 A | 7/2006 |
| JP | 2009-177044 A | 8/2009 |

* cited by examiner

SEMICONDUCTOR INTEGRATED CIRCUIT AND SEMICONDUCTOR PHYSICAL QUANTITY SENSOR DEVICE

CROSS-REFERENCE TO RELATED APPLICATIONS

This application is a continuation of International Application No. PCT/JP2012/055005, filed on Feb. 28, 2012, which is based on and claims priority to Japanese Patent Application No. JP 2011-042002, filed on Feb. 28, 2011. The disclosure of the Japanese priority application and the PCT application in their entirety, including the drawings, claims, and the specification thereof, are incorporated herein by reference.

BACKGROUND

1. Field of the Invention

Embodiments of the invention relate to semiconductor integrated circuits and semiconductor physical quantity sensor devices.

2. Related Art

To date, a laser trimming method has been commonly known as a method of regulating the output characteristics of a physical quantity sensor. The heretofore known laser trimming method has a drawback in that, even in the event that fluctuation occurs in the physical quantity sensor output characteristics in an assembly step after trimming, re-regulation is not possible.

Because of this, in recent years, an electrical trimming method, whereby the physical quantity sensor output characteristics can be regulated after the finish of the assembly step, has been used. With electrical trimming, however, a large number of control terminals are necessary for inputting and outputting trimming data, writing data into an EPROM, and the like. Because of this, there is a problem in that manufacturing cost increases due to factors such as the number of wire bondings increasing.

Therefore, a device wherein the number of terminals is reduced by providing a plurality of terminal action threshold voltages using resistive voltage division and a bipolar transistor, and electrical trimming is carried out with a small number of terminals, has been proposed as a device that eliminates this kind of problem (for example, refer to Japanese patent document no. JP-A-6-29555 ("JP-A-6-29555")).

Also, a device that uses an EPROM as a storage device, wherein the number of terminals is reduced by one of one or two writing terminals supplying voltage for writing data into a storage circuit including the EPROM doubling as an external clock input terminal, has been proposed as another device (for example, refer to Japanese patent document no. JP-A-2003-302301 ("JP-A-2003-302301")).

Also, it is proposed in JP-A-2003-302301 that a further two writing terminals are commonized, thus reducing the number of terminals, by providing a voltage conversion circuit that converts writing voltage supplied from an EPROM writing terminal, thereby generating a different writing voltage. Also, with regard to JP-A-2003-302301, wherein a semiconductor physical quantity sensor device can be manufactured by a CMOS process, the external clock input terminal (5.0V or less) and a writing terminal that needs a high voltage (in the region of 20V) are commonized. Further, using a signal distinguishing means (circuit), it is determined from the size of an input voltage whether the voltage is a writing voltage to the storage circuit or an external clock.

Because of this, when applying JP-A-2003-302301, it is necessary that the signal distinguishing means circuit is configured of a CMOS element, or the like, with a high breakdown voltage. Also, a stabilizing power source circuit that can generate a stable output voltage, without being affected by variation in output transistor characteristics even in the event that a load current in a load with low voltage and low power consumption is of a low value such as to respond to element leakage current, has been proposed as a circuit that generates output voltage (for example, refer to Japanese patent document no. JP-A-2000-194431 ("JP-A-2000-194431")).

Also, a power source circuit that, as it uses a CMOS type transistor wherein circuit current is limited by a resistor inserted between a back gate and a source and thus does not increase to a predetermined value or above, prevents dielectric breakdown even in a short-circuit condition has been proposed as another circuit (for example, refer to Japanese Patent No. 3,068,540 ("3,068,540")).

Also, a power source circuit configured to include in one portion a step-up switching power source circuit has been proposed as another circuit (for example, refer to Japanese Patent No. 3,480,389 ("3,480,389")). Also, an internal voltage generating circuit such that, even in the event that there is a temporary drop in the outputs of the internal voltage generating circuit and a constant potential generating circuit with small circuit areas, wherein there are a large number of correction points and a highly accurate output voltage is obtained, the internal voltage can reliably be generated again has been proposed as another circuit (for example, refer to Japanese patent document no. JP-A-2001-242949 ("JP-A-2001-242949")).

Also, a device wherein a voltage supply circuit has a power source step-up unit, an amplifier that acts with voltage generated by the power source step-up unit as power source voltage and supplies bias voltage to a sensor, and an output voltage setting circuit having a feedback resistor unit for the amplifier, wherein the resistance value of the feedback resistor unit is determined in accordance with the setting value of the sensor bias voltage, has been proposed as another circuit (for example, refer to Japanese patent document no. JP-A-2006-191359 ("JP-A-2006-191359")). In JP-A-2006-191359, when sensitivity of each of sensor apparatuses, for example, condenser mic units, varies, it is possible to adjust the sensitivity.

However, in JP-A-2003-302301, no specific circuit example is disclosed for the voltage conversion circuit that converts writing voltage supplied from the writing terminal, thereby generating a different writing voltage. FIG. 10 is a block diagram showing a configuration of a heretofore known semiconductor physical quantity sensor device. FIG. 10 is a semiconductor physical quantity sensor device with an EPROM as a main memory circuit, and corresponds to FIG. 10 of JP-A-2003-302301. A voltage conversion circuit 18a, corresponding to a voltage conversion circuit indicated by reference sign 118 in FIG. 10 of JP-A-2003-302301, generates a writing voltage 2 by converting a writing voltage 1, but no specific circuit diagram of the voltage conversion circuit 18a is shown in JP-A-2003-302301. Also, in FIG. 10 of JP-A-2003-302301, a transmission line of the writing voltage 1 and writing voltage 2 is shown by one arrow.

The semiconductor physical quantity sensor device 5 includes an action selection circuit 11, an auxiliary memory circuit 12, a main memory circuit 13, a regulation circuit 14, a sensor element 15, such as a Wheatstone bridge, an amplifier circuit 16, a signal distinguishing means 17, the voltage conversion circuit 18a, and five terminals 21 to 25, from a first to a fifth. Also, in JP-A-2003-302301, no specific circuit example is disclosed for the auxiliary memory circuit 12 and main memory circuit 13 either.

To write data into the unshown EPROM configuring the main memory circuit 13, firstly, a voltage (a writing voltage 2) of in the region of 10V is applied between the source and drain in a condition in which a voltage (a writing voltage 1) of in the region of 20V is applied to the control gate. Then, current is caused to flow between the source and drain, and it is necessary for a charge to be trapped in the floating gate by an electrical field generated between the drain and gate.

In general, when writing into an EPROM, it is preferable that the writing voltage and number of writes are of constant values in order to prevent damage to the element when writing and to keep the amount of charge injected into the control gate practically constant (to keep the writing voltage constant). Therefore, it is necessary that the writing voltage 1 and writing voltage 2 are kept constant.

Also, it is common that writing into an EPROM is not carried out one bit at a time, but is carried out for all bits simultaneously, or for a number of blocks at a time. When writing into all bits simultaneously, or into the EPROMs in a certain block simultaneously, a switch is provided between the drain of each EPROM and the writing voltage 2. Then, the switches of bits to be written into are turned on, so that a current flows between the source and drain. Meanwhile, the switches of bits not to be written into are turned off, so that no current flows between the source and drain.

The ratio between the bits to be written into and bits not to be written into within the block differs in accordance with a regulation value (trimming conditions). Because of this, the number of EPROMs through which current flows simultaneously for one write is not constant. Therefore, for example, when forming the writing voltage 2 from the writing voltage 1 using resistive division (voltage division), the load (resistance value) changes in accordance with the number of EPROMs through which current flows. Further, as the combined resistance of this and the resistance used for the resistive division changes, it is not possible to keep the writing voltage 2 constant.

To keep the writing voltage 2 constant, it is necessary that the load dependency of the voltage conversion circuit 18a is low when forming the writing voltage 2 from the writing voltage 1. That is, it is necessary to arrange that the voltage conversion circuit 18a does not depend on the number of EPROMs configuring the main memory circuit 13 that have continuity.

Also, in JP-A-2000-194431, 3,068,540 and 3,480,389, there is no description of the power source circuit being applied to a semiconductor physical quantity sensor device. Also, in JP-A-2001-242949 and JP-A-2006-191359, a description is given of a power source circuit wherein the output voltage is changed by changing the resistance value of the resistive voltage dividing circuit, but there is no description of using the output voltage (writing voltage 2) as a writing voltage for a plurality of EPROMs.

Also, in JP-A-6-29555, a bipolar transistor and an EPROM fabricated by a CMOS process exist together, meaning that a BiCMOS process is necessary. Because of this, there is a problem in that there are more steps than with only a CMOS process, leading to an increase in cost. Also, in the case of JP-A-2003-302301, manufacture is possible with only a CMOS process, but as it is necessary to configure the signal distinguishing means circuit with a high breakdown voltage CMOS element or the like, there is a problem in that the element size increases, and thus the circuit area increases.

Also, when providing an ESD (Electro-Static Discharge) protection element such as a ZD (Zener Diode) in a high-voltage terminal such as a writing terminal, it is necessary to connect a plurality of ZDs in series, and there is a problem in that the area of the protection element is larger than that in a low-voltage signal terminal.

Also, even when a high-voltage terminal and low-voltage terminal are commonized, the same protection element as for a high-voltage terminal is necessary for the commonized terminals, meaning that an area reduction advantage is such that it is only possible to reduce the area by an amount equivalent to the protection element of the low-voltage terminal with the smaller area. Consequently, in JP-A-2003-302301, there is a problem in that the area reduction advantage from the commonizing of terminals is small due to the increase in area caused by the addition of the high breakdown voltage signal distinguishing circuit, and it is not possible to expect a significant reduction in cost. Thus, as is described above, there is a need in the art for an improved semiconductor integrated circuit and semiconductor physical quantity sensor device.

SUMMARY OF THE INVENTION

Embodiments of the invention address this and other needs. Embodiments of the invention provide a low-cost semiconductor integrated circuit and semiconductor physical quantity sensor device such that it is possible to keep the writing voltage of an EPROM configuring a main memory circuit constant during electrical trimming.

In some embodiments, a semiconductor integrated circuit includes a data input terminal that inputs serial digital data, a ground terminal that supplies ground potential, a power source terminal that supplies power source voltage, an auxiliary memory circuit that temporarily stores trimming data input from the data input terminal, a programmable read only main memory circuit that stores trimming data stored in the auxiliary memory circuit using an electrical rewrite action, a writing terminal that inputs an external clock, or that supplies a first writing voltage, equal to or higher than the power source voltage, for writing data into the main memory circuit, a variable resistance circuit that, based on the first writing voltage input from the writing terminal, generates a second writing voltage, which is equal to or higher than the power source voltage and wherein the first writing voltage is divided by resistance of the main memory circuit, for writing data into the main memory circuit, and supplies the second writing voltage to the main memory circuit, and a signal distinguishing means that determines whether voltage applied to the writing terminal is an external clock, or whether it is the first writing voltage, supplies the external clock to the auxiliary memory circuit, and supplies the first writing voltage to the main memory circuit. Further, the auxiliary memory circuit is configured of a shift register wherein a plurality of flip-flops are cascade connected. The main memory circuit includes a first series circuit, corresponding to each flip-flop, formed of a first switch and an EPROM connected in series to the first switch and driven by the first writing voltage. The variable resistance circuit includes a second series circuit, corresponding to each flip-flop, formed of a second switch and a resistor connected in series to the second switch. A plurality of the first series circuits and a plurality of the second series circuits are connected in series. When the first writing voltage is applied, the number of the second switches turned on is the same as the number of the first switches turned on.

Also, the semiconductor integrated circuit according to the heretofore described aspect of the invention is such that the first switch and second switch are formed of p-channel MOSFETs. Also, the semiconductor integrated circuit is characterized in that when the first writing voltage is applied, the turning on and off of the first switch of the first series circuit corresponding to a certain flip-flop is controlled based on the output of the flip-flop, and the turning on and off of the second switch of the second series circuit corresponding to a certain flip-flop is controlled based on the output of the flip-flop.

In some embodiments, the semiconductor integrated circuit includes a data input terminal that inputs serial digital data, a ground terminal that supplies ground potential, a power source terminal that supplies power source voltage, an auxiliary memory circuit that temporarily stores trimming data input from the data input terminal, a programmable read only main memory circuit that stores trimming data stored in the auxiliary memory circuit using an electrical rewrite action, a writing terminal that inputs an external clock, or that supplies a first writing voltage, equal to or higher than the power source voltage, for writing data into the main memory circuit, a constant resistance circuit that, based on the first writing voltage input from the writing terminal, generates a second writing voltage, which is equal to or higher than the power source voltage and wherein the first writing voltage is divided by resistance of the main memory circuit, for writing data into the main memory circuit, and supplies the second writing voltage to the main memory circuit, and a signal distinguishing means that determines whether voltage applied to the writing terminal is an external clock, or whether it is the first writing voltage, supplies the external clock to the auxiliary memory circuit, and supplies the first writing voltage to the main memory circuit. Further, the auxiliary memory circuit is configured of a shift register wherein a plurality of flip-flops are cascade connected. The main memory circuit includes a first series circuit, corresponding to each flip-flop, formed of a first switch and an EPROM connected in series to the first switch and driven by the first writing voltage, and a second series circuit, corresponding to each flip-flop, formed of a second switch and a resistor connected in series to the second switch. A plurality of the first series circuits and a plurality of the second series circuits are connected in parallel. Also, a plurality of the first series circuits and plurality of the second series circuits and the constant resistance circuit are connected in series. When the first writing voltage is applied, the first series circuit and second series circuit corresponding to the same flip-flop are such that when the first switch is turned on, the second switch is turned off, while when the first switch is turned off, the second switch is turned on.

Also, the semiconductor integrated circuit according to the heretofore described aspect of the invention is such that the first switch and second switch are formed of p-channel MOSFETs. Also, the semiconductor integrated circuit is characterized in that when the first writing voltage is applied, the turning on and off of the first switch of the first series circuit corresponding to a certain flip-flop is controlled based on the output of the flip-flop, and the turning on and off of the second switch of the second series circuit corresponding to a certain flip-flop is controlled based on the output of the flip-flop.

In some embodiments, the semiconductor physical quantity sensor device includes a sensor element that generates an electrical signal in accordance with a detected physical quantity, an output terminal that outputs the electrical signal generated by the sensor element to the exterior, a data input terminal that inputs serial digital data, which form trimming data for regulating the output characteristics of the sensor element, a ground terminal that supplies ground potential, a power source terminal that supplies power source voltage, an auxiliary memory circuit that temporarily stores trimming data input from the data input terminal, a programmable read only main memory circuit that stores trimming data stored in the auxiliary memory circuit using an electrical rewrite action, a writing terminal that inputs an external clock, or that supplies a first writing voltage, equal to or higher than the power source voltage, for writing data into the main memory circuit, a variable resistance circuit that, based on the first writing voltage input from the writing terminal, generates a second writing voltage, which is equal to or higher than the power source voltage and wherein the first writing voltage is divided by resistance of the main memory circuit, for writing data into the main memory circuit, and supplies the second writing voltage to the main memory circuit, an action selection circuit that controls an action of the auxiliary memory circuit and main memory circuit based on one portion of digital data stored in the auxiliary memory circuit, a signal distinguishing means that determines whether voltage applied to the writing terminal is an external clock, or whether it is the first writing voltage, supplies the external clock to the auxiliary memory circuit, and supplies the first writing voltage to the main memory circuit, and a regulation circuit that regulates the output characteristics of the sensor element based on trimming data stored in the auxiliary memory circuit or trimming data stored in the main memory circuit. Further, the auxiliary memory circuit is configured of a shift register wherein a plurality of flip-flops are cascade connected. The main memory circuit includes a first series circuit, corresponding to each flip-flop, formed of a first switch and an EPROM connected in series to the first switch and driven by the first writing voltage. The variable resistance circuit includes a second series circuit, corresponding to each flip-flop, formed of a second switch and a resistor connected in series to the second switch. A plurality of the first series circuits and a plurality of the second series circuits are connected in series. When the first writing voltage is applied, the number of the second switches turned on is the same as the number of the first switches turned on.

In some embodiments, the semiconductor physical quantity sensor device according to the heretofore described aspect of the invention is such that the first switch and second switch are formed of p-channel MOSFETs. Also, the semiconductor physical quantity sensor device is characterized in that when the first writing voltage is applied, the turning on and off of the first switch of the first series circuit corresponding to a certain flip-flop is controlled based on the output of the flip-flop, and the turning on and off of the second switch of the second series circuit corresponding to a certain flip-flop is controlled based on the output of the flip-flop.

Also, in order to solve the heretofore described problems, and achieve the object of the invention, a semiconductor physical quantity sensor device according to the invention has the following characteristics. The semiconductor physical quantity sensor device includes a sensor element that generates an electrical signal in accordance with a detected physical quantity, an output terminal that outputs the electrical signal generated by the sensor element to the exterior, a data input terminal that inputs serial digital data, which form trimming data for regulating the output characteristics of the sensor element, a ground terminal that supplies ground potential, a power source terminal that supplies power source voltage, an auxiliary memory circuit that temporarily stores trimming data input from the data input terminal, a programmable read only main memory circuit that stores trimming data stored in the auxiliary memory circuit using an electrical rewrite action, a writing terminal that inputs an external clock, or that supplies a first writing voltage, equal to or higher than the power source voltage, for writing data into the main memory circuit, a constant resistance circuit that, based on the first writing voltage input from the writing terminal, generates a second writing voltage, which is equal to or higher than the power source voltage and wherein the first writing voltage is divided by resistance of the main memory circuit, for writing data into the main memory circuit, and supplies the second writing voltage to the main memory circuit, an action selection circuit that controls an action of the auxiliary memory circuit and main memory circuit based on one portion of digital data stored in the auxiliary memory circuit, a signal distinguishing means that determines whether voltage applied to the writing terminal is an external clock, or whether it is the first writing voltage, supplies the external clock to the auxiliary memory circuit, and supplies the first writing voltage to the main memory circuit, and a regulation circuit that regulates the output characteristics of the sensor element based on trimming data stored in the auxiliary memory circuit or trimming data stored in the main memory circuit. Further, the auxiliary memory circuit is configured of a shift register wherein a plurality of flip-flops are cascade connected. The main memory circuit includes a first series circuit, corresponding to each flip-flop, formed of a first switch and an EPROM connected in series to the first switch and driven by the first writing voltage, and a second series circuit, corresponding to each flip-flop, formed of a second switch and a resistor connected in series to the second switch. A plurality of the first series circuits and a plurality of the second series circuits are connected in parallel. Also, a plurality of the first series circuits and plurality of the second series circuits and the constant resistance circuit are connected in series. When the first writing voltage is applied, the first series circuit and second series circuit corresponding to the same flip-flop are such that when the first switch is turned on, the second switch is turned off, while when the first switch is turned off, the second switch is turned on.

In some embodiments, the semiconductor physical quantity sensor device according to the heretofore described aspect of the invention is such that the first switch and second switch are formed of p-channel MOSFETs. Also, the semiconductor physical quantity sensor device is characterized in that when the first writing voltage is applied, the turning on and off of the first switch of the first series circuit corresponding to a certain flip-flop is controlled based on the output of the flip-flop, and the turning on and off of the second switch of the second series circuit corresponding to a certain flip-flop is controlled based on the output of the flip-flop.

Also, the semiconductor physical quantity sensor device according to the heretofore described aspects of the invention is characterized by being configured of only an active element and a passive element, formed on the same semiconductor chip, manufactured by a CMOS manufacturing process.

According to embodiments of the invention, even when the first writing voltage and second writing voltage terminals are commonized, electrical trimming is possible with the voltage when writing into the EPROM kept constant. Also, according to the invention, as it possible for the first writing voltage and second writing voltage terminals to be commonized, it is possible to reduce manufacturing cost.

According to the semiconductor integrated circuit and semiconductor physical quantity sensor device according to embodiments of the invention, an advantage is achieved in that it is possible to provide a low-cost semiconductor integrated circuit and semiconductor physical quantity sensor device such that it is possible to carry out electrical trimming with the writing voltage of an EPROM configuring a main memory circuit kept constant.

DETAILED DESCRIPTION

Figure 1:
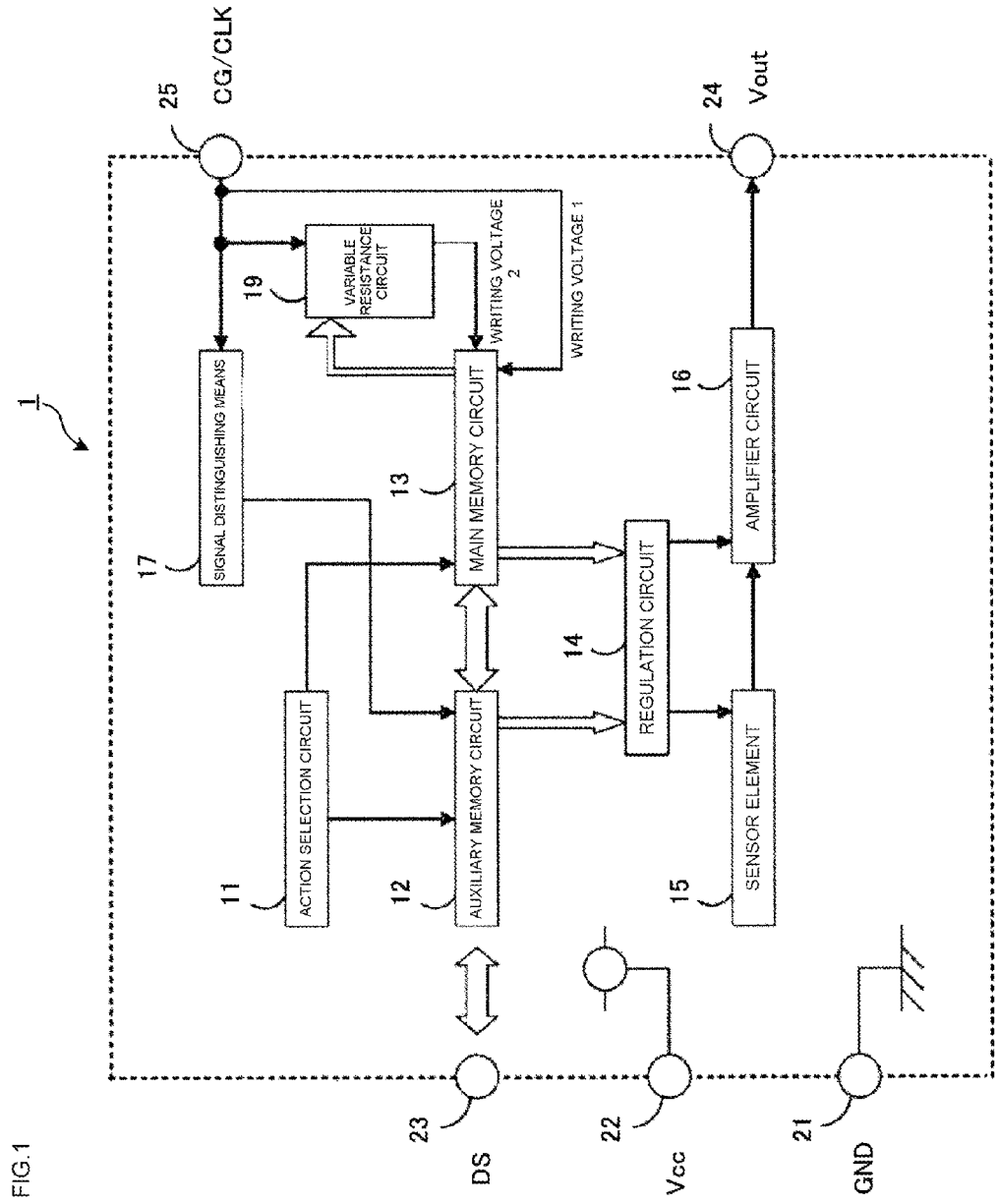
FIG. 1 is a block diagram showing a configuration of a semiconductor physical quantity sensor device according to Embodiment 1 of the invention.

Hereafter, referring to the attached drawings, a detailed description will be given of embodiments of a semiconductor integrated circuit and semiconductor physical quantity sensor device according to the invention. A specific example of the semiconductor physical quantity sensor device described herein is a vehicle-mounted semiconductor pressure sensor, or the like. However, provided that the semiconductor integrated circuit is one including an EPROM for regulating another analog circuit, the invention can be applied in the same way, and the same advantages are achieved, regardless of the semiconductor physical quantity sensor device. In the following description of the embodiments and attached drawings, the same reference signs are given to identical configurations, and a redundant description is omitted. Also, the reference signs in the drawings are such that the same reference signs are given to regions the same as those heretofore known.

Embodiment 1

Figure 10:
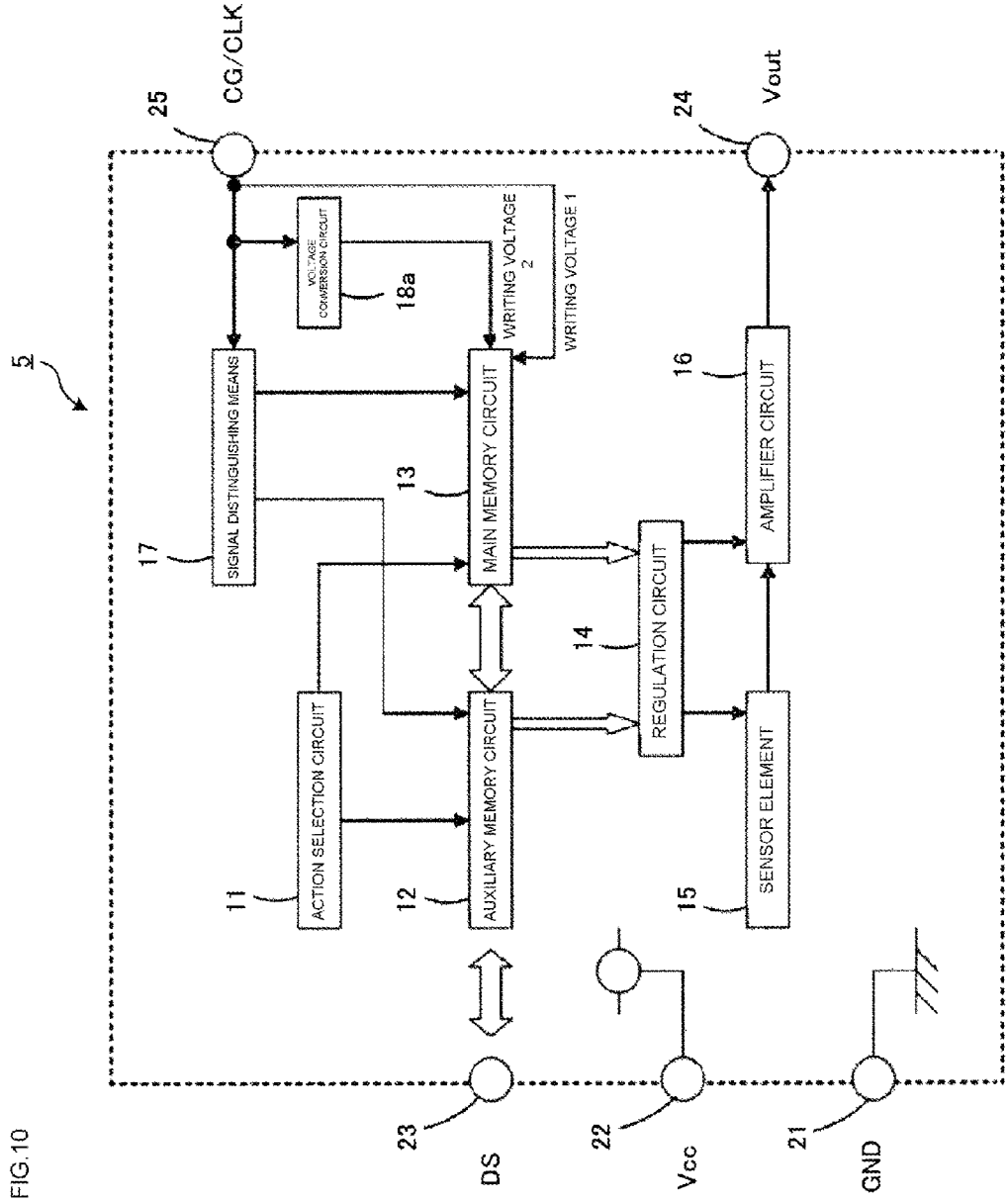
FIG. 10 is a block diagram showing a configuration of a heretofore known semiconductor physical quantity sensor device.

FIG. 1 is a block diagram showing a configuration of a semiconductor physical quantity sensor device according to Embodiment 1 of the invention. A difference between the semiconductor physical quantity sensor device 1 according to Embodiment 1 of the invention of FIG. 1 and a heretofore known semiconductor physical quantity sensor device 5 of FIG. 10 is that a voltage conversion circuit 18a of the heretofore known semiconductor physical quantity sensor device 5 is replaced with a variable resistance circuit 19.

As shown in FIG. 1, the semiconductor physical quantity sensor device 1 includes an action selection circuit 11, an auxiliary memory circuit 12, a main memory circuit 13, a regulation circuit 14, a sensor element 15, such as a Wheatstone bridge, an amplifier circuit 16, a signal distinguishing means 17, the variable resistance circuit 19, and five terminals 21 to 25, from a first to a fifth.

The first terminal 21 is a ground terminal (GND terminal) that supplies the ground potential of the semiconductor physical quantity sensor device 1. The second terminal 22 is a power source terminal (Vcc terminal) that supplies the power source voltage of the semiconductor physical quantity sensor device 1. The third terminal 23 is a terminal (DS terminal) that carries out an input and output of serial digital data (serial data). The fourth terminal 24 is an output terminal (Vout terminal) that outputs a signal of the semiconductor physical quantity sensor device 1 to the exterior. The fifth terminal 25 is a write terminal that supplies a voltage higher than the power source voltage applied to the second terminal 22. Also, the fifth terminal 25 also acts as a terminal (CG/CLK terminal) that inputs an external clock.

The sensor element 15 generates an electrical signal in accordance with a physical quantity detected. The auxiliary memory circuit 12, at an action timing based on an external clock (CLK), converts serial digital data supplied from the exterior into parallel digital data (parallel data) for internal use. Also, the auxiliary memory circuit 12 converts internally used parallel digital data into serial digital data for output to the exterior. Also, the auxiliary memory circuit 12 supplies control data to the action selection circuit 11. That is, the auxiliary memory circuit 12 has a function of temporarily storing trimming data input from the DS terminal 23.

The main memory circuit 13, in accordance with the voltage applied to the fifth terminal 25, stores trimming data obtained from parallel digital data supplied from the auxiliary memory circuit 12 in an EPROM. That is, the main memory circuit 13 is a memory circuit of a programmable read only EPROM, which stores trimming data stored in the auxiliary memory circuit 12 using an electrical rewrite action, and the like.

The action selection circuit 11, based on control data supplied from the auxiliary memory circuit 12, supplies a signal controlling an input and output of data into and from the auxiliary memory circuit 12 and main memory circuit 13. That is, the action selection circuit 11 has a function of controlling actions of the auxiliary memory circuit 12 and main memory circuit 13 based on one portion of digital data stored in the auxiliary memory circuit 12.

The amplifier circuit 16 amplifies an output signal of the sensor element 15, and outputs it to the exterior via the fourth terminal 24. The regulation circuit 14, based on trimming data supplied from the auxiliary memory circuit 12 or main memory circuit 13, carries out a regulation of the sensitivity of the sensor element 15, taking temperature characteristics into consideration, and carries out a regulation of the offset of the amplifier circuit 16, taking temperature characteristics into consideration. That is, the regulation circuit 14 regulates the output characteristics of the sensor element 15 based on trimming data stored in the auxiliary memory circuit 12, or based on trimming data stored in the main memory circuit 13.

The signal distinguishing means 17 determines whether voltage applied to the fifth terminal 25 is a clock supplied from the exterior, or whether it is writing voltage for writing trimming data into the main memory circuit 13. Further, when the result of the determination is that the voltage is an external clock, the signal distinguishing means 17 supplies the clock to the auxiliary memory circuit 12.

The variable resistance circuit 19 supplies writing voltage 1, which is voltage of the fifth terminal 25, and writing voltage (second writing voltage) 2, wherein the writing voltage 1 is divided, to the main memory circuit 13. That is, the variable resistance circuit 19 has a function of, based on the writing voltage 1 input from the writing terminal, generating the writing voltage 2, which is equal to or higher than the power source voltage and wherein the writing voltage 1 is divided, for writing data into the main memory circuit 13, and supplying the writing voltage 2 to the main memory circuit 13. When a writing voltage considerably higher than the clock, which is a signal "1" or "0" of 0V to 5V, is supplied, the main memory circuit 13 carries out a data write action. Because of this, even in the event that an external clock is input into the main memory circuit 13 via the fifth terminal 25, the main memory circuit 13 does not carry out a write action.

Figure 2:
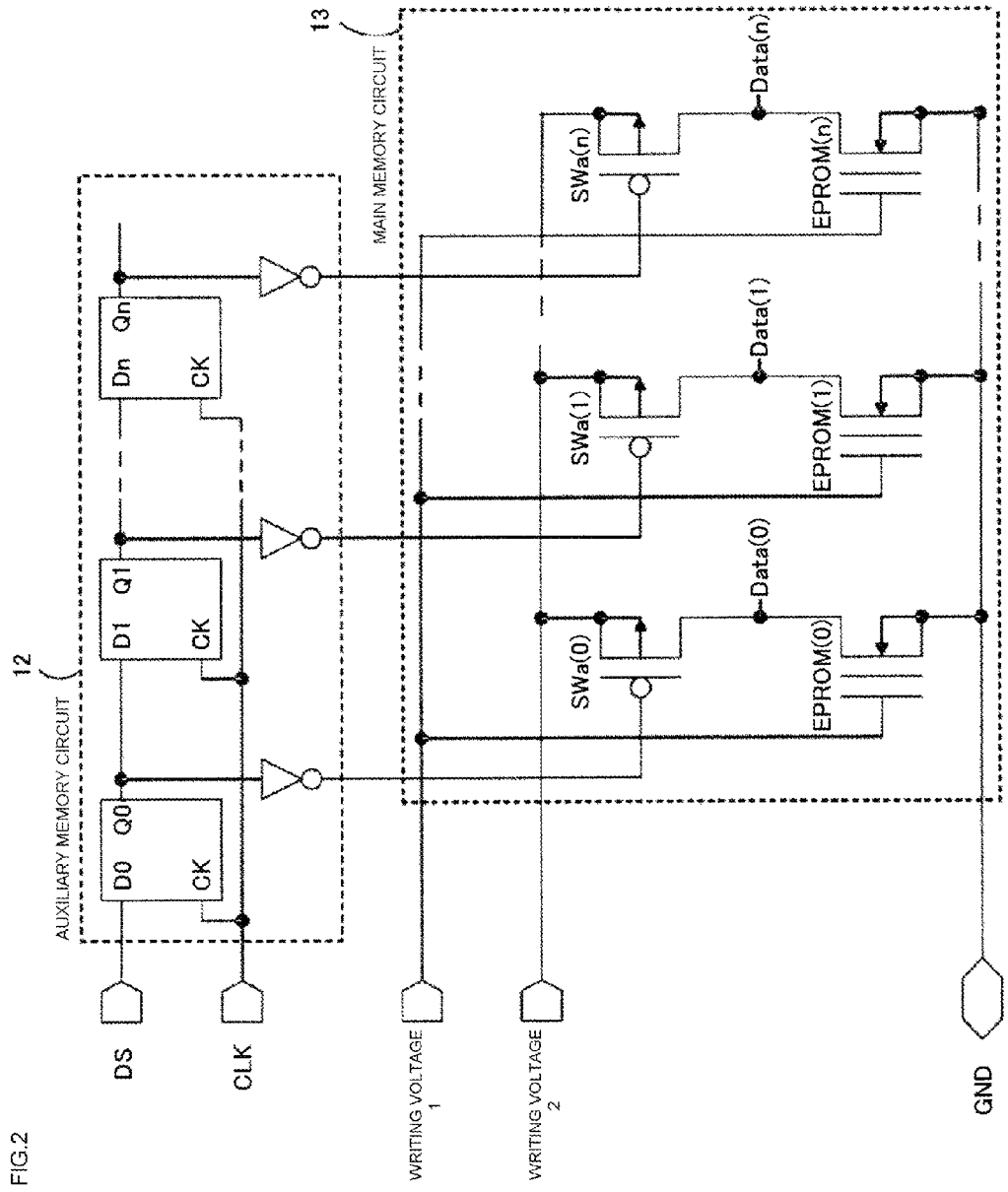
FIG. 2 is a circuit diagram showing a main portion of a memory circuit of FIG. 1.
Figure 3:
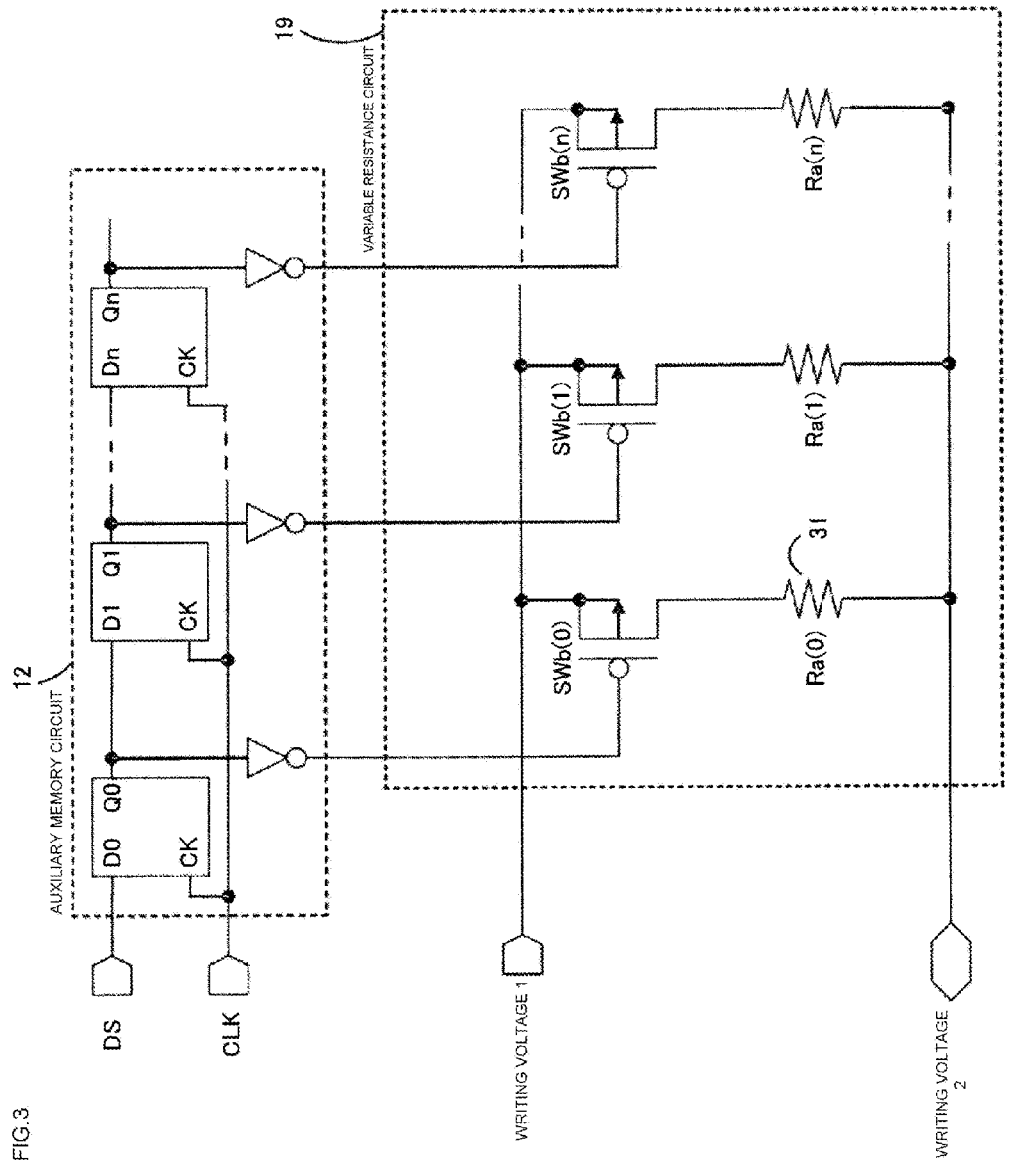
FIG. 3 is a circuit diagram showing in detail a variable resistance circuit of FIG. 1.

FIG. 2 is a circuit diagram showing a main portion of the memory circuit of FIG. 1. The main memory circuit 13 and auxiliary memory circuit 12 shown in FIG. 1 are included in the memory circuit. FIG. 2 shows a circuit configuration when writing data mainly into the main memory circuit 13. Also, FIG. 3 is a circuit diagram showing in detail the variable resistance circuit of FIG. 1. The auxiliary memory circuit 12 is configured of a shift register wherein a plurality of flip-flops are cascade-connected, and a plurality of inversion circuits into which outputs Q0 to Qn of each D flip-flop are input, and which invert the outputs Q0 to Qn, and output them to switches SWa(0) to SWa(n) respectively. The flip-flops configuring the auxiliary memory circuit 12 may be, for example, D flip-flops.

The inversion circuits are necessary in order to drive p-channel MOSFETs, which are the switches SWa(0) to SWa (n). When the flip-flop outputs Q0 to Qn are "H", there is an inverted output of "L" from the inversion circuits, and the switches SWa(0) to SWa(n) are turned on. When adopting a configuration such that the switches SWa(0) to SWa(n) are turned on when the flip-flop outputs Q0 to Qn are "L", either a configuration is such that no inversion circuit is provided, or a configuration is such that further inversion circuits are added between the flip-flop outputs Q0 to Qn and switches SWa(0) to SWa(n).

The main memory circuit 13 is configured of the switches SWa(0) to SWa(n), which are turned on and off based on the flip-flop outputs Q0 to Qn of the auxiliary memory circuit 12, and an EPROM(0) to EPROM(n), connected in series to the switches SWa(0) to SWa(n) respectively, into which a write is carried out by the writing voltage 1 being applied.

The output of the auxiliary memory circuit 12 is input into the main memory circuit 13 and variable resistance circuit 19 shown in FIG. 3 via the inversion circuits. The variable resistance circuit 19 will be described hereafter. In the memory circuit shown in FIG. 2, data are input into the auxiliary memory circuit 12, which is formed of a shift register, by data being input from the DS terminal and a clock signal being input from the CG/CLK terminal. The switches SWa(0) to SWa(n) are turned on and off based on the flip-flop outputs Q0 to Qn in the shift register. For example, as the gate voltage of the switch Swa(1) is "L (0V)" when the output Q1 is "H", the switch Swa(1) is turned on. Conversely, as the gate voltage of the switch Swa(1) is "H (5V)" when Q1 is "L", the switch Swa(1) is turned off.

When the writing voltage 1 and writing voltage 2 are applied to the main memory circuit 13 in a state in which data have entered the shift register in this way, current flows through the EPROMs, of the EPROM(0) to EPROM(n), of the bits of which the switches SWa(0) to SWa(n) are turned on. Further, a charge is trapped in the floating gates of the EPROMs of the bits of which the switches SWa(0) to SWa(n) are turned on due to an electric field caused by the writing voltage 1.

In an EPROM in whose floating gate a charge is trapped, the threshold voltage rises. Voltage applied to the control gate of an EPROM when data written into the EPROM are retrieved is set so as to be, for example, a voltage in the region of 4V, generated by dividing the power source voltage. Because of this, an EPROM in whose floating gate no charge is trapped is turned into an on-state simply by a voltage in the region of 4V being applied to the control gate. Meanwhile, as the threshold voltage has risen, an EPROM in whose floating gate a charge is trapped is not turned on by a voltage in the region of 4V, and is thus in an off-state. Also, when retrieving data written into the EPROM(0) to EPROM(n), all the switches SWa(0) to SWa(n) are controlled so as to be in an off-state (not shown).

Because of this, drain voltages Data(0) to Data(n) of the EPROM(0) to EPROM(n) respectively become the GND potential or a floating potential. By each of the drain voltages Data(0) to Data(n) being pulled up by a resistor to the power source voltage (5V) (not shown), the drain voltages Data(0) to Data(n) are fixed at 0V or 5V.

The values of the drain voltages Data(0) to Data(n) are input into the regulation circuit 14, and the characteristics of the sensor element 15 and amplifier circuit 16 are regulated. As shown in FIG. 3, the variable resistance circuit 19 is configured of switches SWb(0) to SWb(n), which are turned on and off in response to the flip-flop outputs Q0 to Qn of the auxiliary memory circuit 12, and resistors Ra(0) to Ra(n) connected in series to the switches SWb(0) to SWb(n) respectively. The auxiliary memory circuit 12 shown in FIG. 3 is the auxiliary memory circuit 12 shown in FIG. 2.

A number of resistors Ra(0) to Ra(n) equal to the total number of bits of the main memory circuit 13 are provided in the variable resistance circuit 19, or a number of resistors Ra(0) to Ra(n) equal to a number of bits corresponding to EPROMs of the EPROM (0) to EPROM(n) into which writes are carried out simultaneously are provided. The switches SWb(0) to SWb(n) are provided in series corresponding to these kinds of resistor Ra(0) to Ra(n) respectively. Because of this, a number of switches SWb(0) to SWb(n) equal to a number of bits for which the flip-flop outputs Q0 to Qn of the auxiliary memory circuit 12, corresponding to the bits of the main memory circuit 13, are "H", that is, a number the same as the number of the EPROM (0) to EPROM(n) of the main memory circuit 13 written into, are turned on.

Because of this, when the EPROMs of N bits are written into, the writing voltage 2 is divided by the on-state resistance value of the EPROMs of N bits (1/N of the on-state resistance value of one EPROM) and the on-state resistance value of the variable resistance circuit 19 (1/N of the resistance value of one resistor), meaning that, whatever the number of N, the writing voltage 2 is divided by the same ratio (the ratio between the on-state resistance value of one EPROM and the resistance value of one resistor). Because of this, the writing voltage 2 is constant, regardless of the number of bits written into (independent of the trimming conditions).

Herein, a description will be given of the relationship between the writing voltage 1 and writing voltage 2. The value of resistance between the writing voltage 2 and the GND potential is taken to be Rx, while the value of resistance between the writing voltage 1 and writing voltage 2 is taken to be Ry. For example, when writing "1" into the EPROM (0) to EPROM (2) of three bits in the main memory circuit 13 of FIG. 2, the switches SWa(0) to SWa(2) of the three bits provided in the main memory circuit 13 are turned on by the three outputs Q0 to Q2 of the outputs Q0 to Qn of the auxiliary memory circuit 12.

At this time, when a series resistance value of the EPROM (m) and switch SWa(m) of one bit is taken to be α (m=0, 1, ..., n), the combined resistance value of the main memory circuit 13, three of the series resistance value a being connected in parallel, is α/3, and the value of the resistance Rx between the writing voltage 2 and GND potential is α/3.

Meanwhile, the switches SWb(0) to SWb(n) in the variable resistance circuit 19 of FIG. 3 provided between the writing voltage 1 and writing voltage 2 are also such that the switches SWb(0) to SWb(2) of the three bits are turned on in accordance with the output of the auxiliary memory circuit 12.

When a series resistance value of the switch SWb(m) and resistor Ra(m) of one bit is taken to be β (m=0, 1, ..., n), the combined resistance value of the variable resistance circuit 19 is β/3, and the value of the resistance Ry between the writing voltage 1 and writing voltage 2 is β/3. At this time, the writing voltage 2 is as in the following Equation (1).

$$\text{Writing voltage } 2 = Rx/(Rx + Ry) \times \text{writing voltage } 1 \quad (1)$$
$$= (\alpha/3)/\{(\alpha/3) + (\beta/3)\} \times \text{writing voltage } 1$$
$$= \alpha/(\alpha + \beta) \times \text{writing voltage } 1$$

When writing "1" into the EPROM (0) to EPROM (4) of five bits in the main memory circuit 13, the writing voltage 2, being as in the following Equation (2), is the same as in the case shown in Equation (1) above of writing "1" into the EPROM (0) to EPROM (2) of three bits.

$$Rx/(Rx+Ry)=(\alpha/5)/\{(\alpha/5)+(\beta/5)\}=\alpha/(\alpha+\beta) \quad (2)$$

In this way, by changing the variable resistance value in accordance with the combined resistance value of the main memory circuit 13, which changes depending on the number of bits written into, it is possible to keep the writing voltage 2 constant regardless of the number of bits written into, as in the following Equation (3).

$$\text{Writing voltage } 2 = \alpha/(\alpha+\beta) \times \text{writing voltage } 1 \quad (3)$$

At this time, when α=β, the writing voltage 2 is one-half of the writing voltage 1, while when α=2β, it is possible for the writing voltage 2 to be two-thirds of the writing voltage 1.

That is, the writing voltage 2 can be arranged to be any voltage owing to the relationship between the series resistance value α of the EPROM(m) and switch SWa(m) of one bit and the series resistance value β of the switch SWb(m) and resistor Ra(m) of one bit. As previously described, even when the terminals of the writing voltage 1 and writing voltage 2 are commonized, it is possible to keep the writing voltage of the EPROM(0) to EPROM(n) configuring the main memory circuit constant during electrical trimming.

Also, as the terminals of the writing voltage 1 and writing voltage 2 are commonized, the number of terminals is reduced, and furthermore, as it is possible to manufacture an active element and passive element on the same semiconductor chip using a CMOS manufacturing process, it is possible to reduce manufacturing cost.

Provided that the invention is a semiconductor integrated circuit including an EPROM for regulating another analog circuit, the invention can be applied in the same way, and the same advantages can be achieved, regardless of the semiconductor physical quantity sensor device 1. Consequently, according to Embodiment 1, by including the auxiliary memory circuit 12, main memory circuit 13, a signal distinguishing means 17, variable resistance circuit 19, GND terminal 21, Vcc terminal 22, DS terminal 23, and CG/CLK terminal 25, as heretofore described, it is possible to provide a low-cost semiconductor integrated circuit and semiconductor physical quantity sensor such that it is possible to keep the writing voltage of an EPROM configuring the main memory circuit constant.

Embodiment 2

Figure 4:
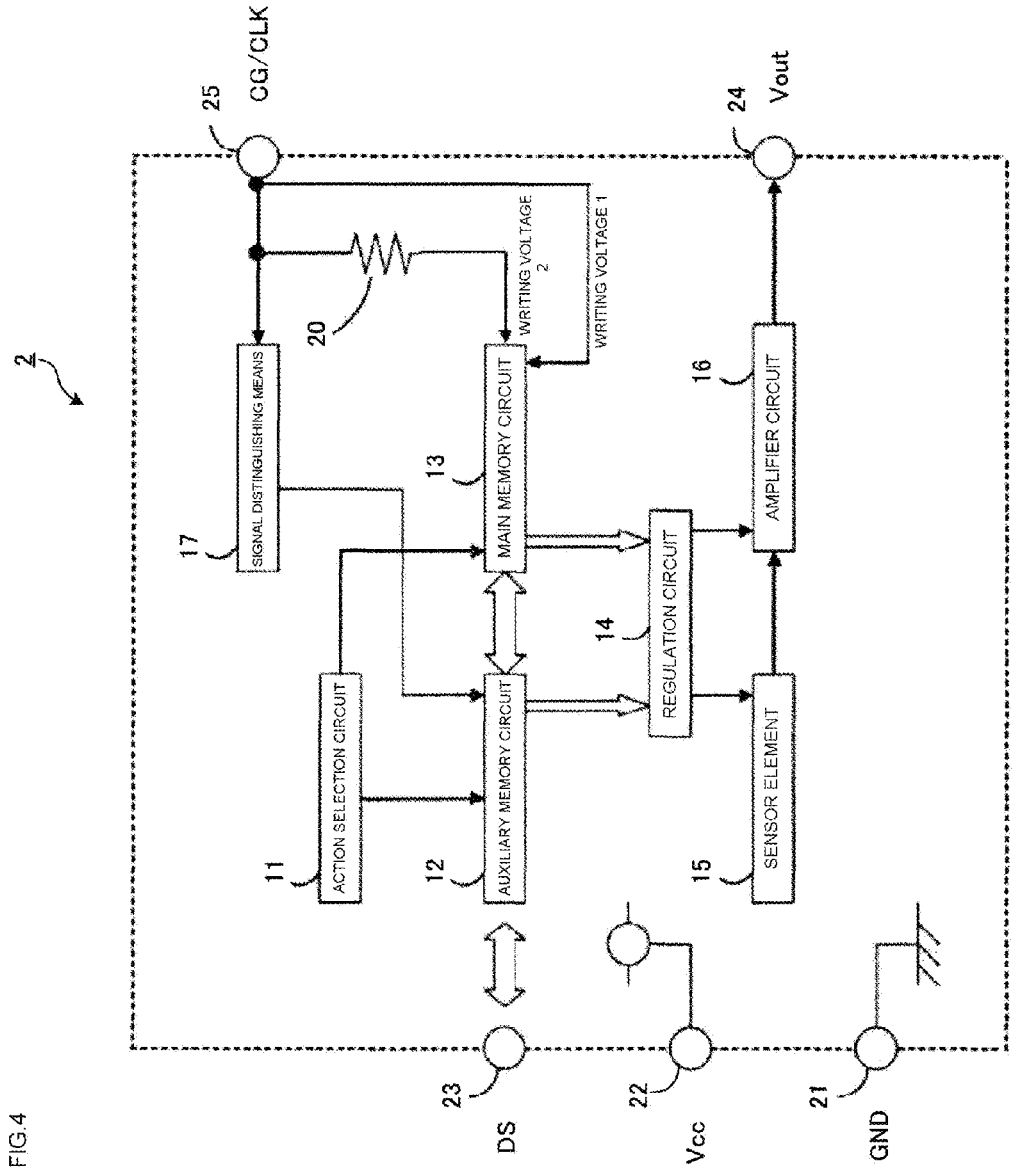
FIG. 4 is a block diagram showing a configuration of a semiconductor physical quantity sensor device according to Embodiment 2 of the invention.

FIG. 4 is a block diagram showing a configuration of a semiconductor physical quantity sensor device 2 according to Embodiment 2 of the invention. A difference between the semiconductor physical quantity sensor device 2 according to Embodiment 2 of the invention of FIG. 4 and the heretofore known semiconductor physical quantity sensor device 5 of FIG. 10 is that the main memory circuit 13 has the kind of circuit configuration of FIG. 5 owing to the voltage conversion circuit 18a of the heretofore known semiconductor physical quantity sensor device 5 being replaced with a constant resistance 20.

As shown in FIG. 4, the semiconductor physical quantity sensor device 2 includes the action selection circuit 11, the auxiliary memory circuit 12, the main memory circuit 13, the regulation circuit 14, the sensor element 15, such as a Wheatstone bridge, the amplifier circuit 16, the signal distinguishing means 17, the constant resistance 20, and the five terminals 21 to 25, from the first to the fifth.

Figure 5:
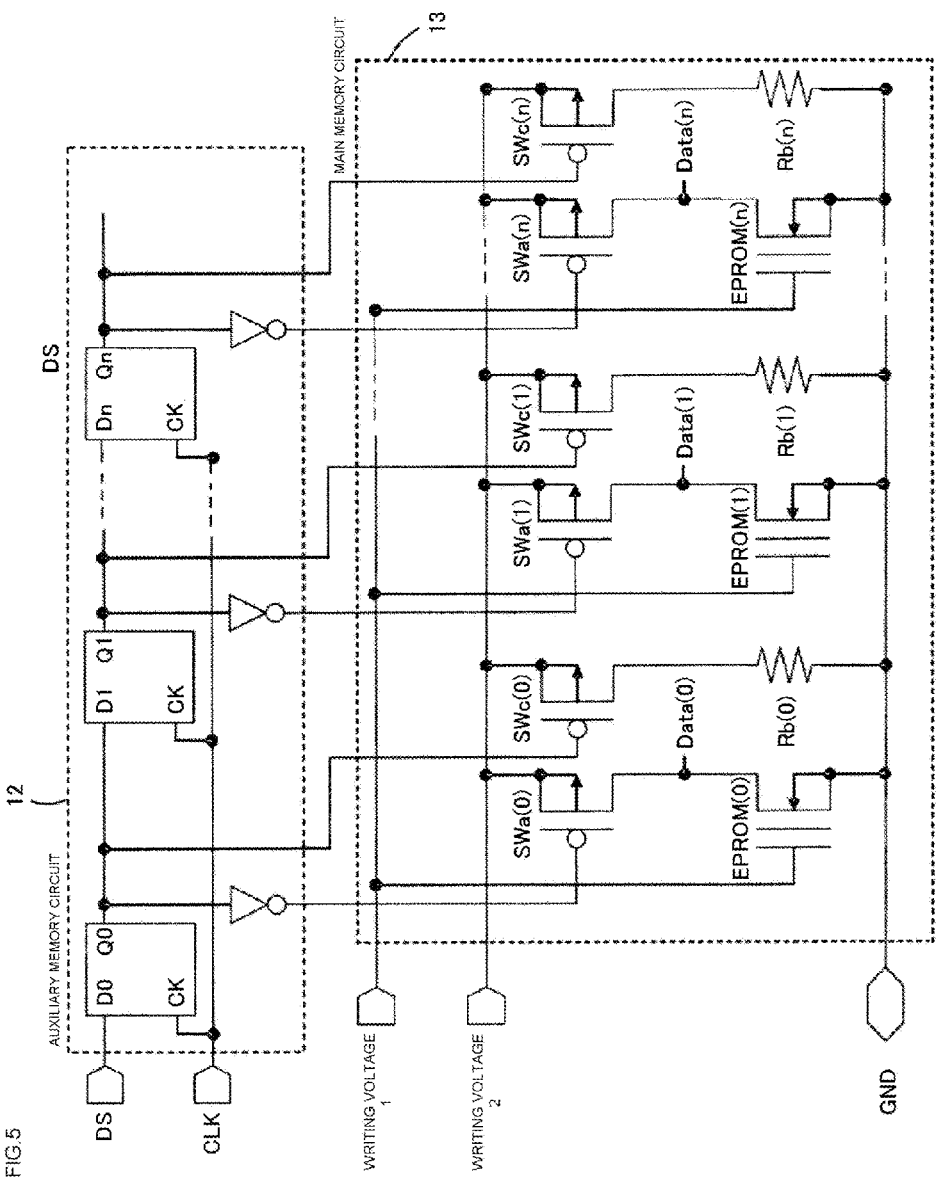
FIG. 5 is a circuit diagram showing a main portion of a memory circuit of FIG. 4.

FIG. 5 is a circuit diagram showing a main portion of the memory circuit of FIG. 4. The main memory circuit 13 and auxiliary memory circuit 12 are included in the memory circuit. The main memory circuit 13 is of a configuration such that a series connection circuit (second series circuit) of a switch SWc(m) and resistor Rb(m) is connected in parallel to a series connection circuit (first series circuit) of the switch SWa(m) and EPROM(m) of FIG. 2 (m=0, 1, ... n). Switches SWc(0) to SWc(n) are turned on and off in accordance with the flip-flop outputs Q0 to Qn of the auxiliary memory circuit 12. The switches SWa(0) to SWa(n) are turned on and off in accordance with outputs wherein the outputs Q0 to Qn of the auxiliary memory circuit 12 are inverted by inversion circuits. Because of this, when the switch SWa(m) is in an on-state, the switch SWc(m) is in an off-state, while when the switch SWa(m) is in an off-state, the switch SWc(m) is in an on-state. In order for the switches SWa(0) to SWa(n) to be turned on when the flip-flop outputs Q0 to Qn are "L", either a configuration is such that no inversion circuit is provided in the auxiliary memory circuit 12, or a configuration is such that further inversion circuits are added, as in Embodiment 1. In order to invert the flip-flop outputs Q0 to Qn input into the switches SWc(0) to SWc(n) at this time, inversion circuits are added one each between the flip-flop outputs Q0 to Qn and switches SWc(0) to SWc(n) respectively.

One each of the switches SWc(0) to SWc(n) and resistors Rb(0) to Rb(n) is provided in all bits of the main memory circuit 13, corresponding to individual bits. The switch SWa(m) and switch SWc(m) are configured of MOSFETs of the same size, and the resistance value of the resistor Rb(m) and the on-state resistance value of the EPROM(m) are the same. The switch SWa(m) and switch SWc(m) are controlled by the output Qm (m=0, 1, ..., n) of each bit (each flip-flop) in the auxiliary memory circuit 12, which is formed of a shift register, so that one switch of the switch SWa(m) and switch SWc(m) is always turned on.

Because of this, the value of resistance between the writing voltage 2 of each bit of the main memory circuit 13 and the GND voltage is the same whether the switches SWa(0) to SWa(n) are turned on or whether the switches SWc(0) to SWc(n) are turned on. Because of this, as the writing voltage 2 is divided by the resistance value of the main memory circuit 13, which is a resistance value equivalent to the combined resistance value of the on-state resistance values of all the bits of the EPROM(0) to EPROM(n), and the constant resistance 20, regardless of the number of bits written into, the writing voltage 2 is divided by the same ratio. Because of this, the writing voltage 2 is constant, regardless of the number of bits written into.

The point that the writing voltage 2 is constant, regardless of the number of bits written into, will be described further. Herein, a description will be given of the relationship between the writing voltage 1 and writing voltage 2. The value of resistance between the writing voltage 2 and the GND potential is taken to be Rx, while the value of resistance between the writing voltage 1 and writing voltage 2 is taken to be Ry.

The number of bits of the main memory circuit of FIG. 5 is taken to be, for example, ten. Also, the series resistance value of the switch SWa(m) and EPROM(m) is taken to be $\gamma$, and the series resistance value of the switch SWc(m) and resistor Rb(m) is also arranged to be $\gamma$. Note that, although the resistors Rb(0) to Rb(n) may be polysilicon resistors, MOSFETs used as resistors, or the like, formed across an insulating film on a semiconductor substrate, it is preferable that a MOSFET the same size as the EPROM(m) is used as the resistor Rb(m). By adopting this kind of configuration, it is easy to arrange the resistance values of the EPROM(m) and resistor Rb(m) to be the same.

When wishing to write "1" into the EPROM (0) to EPROM (2) of three bits, the switches SWa(0) to SWa(2) of the three bits are turned on, and the switches SWc(0) to SWc(6) of seven bits are turned on. At this time, as the combined resistance value of the main memory circuit 13 is the combined resistance value of a combined resistance value $\gamma/3$ of the three bits in which the switches SWa(0) to SWa(2) are turned on and a combined resistance value $\gamma/7$ of the seven bits in which the switches SWc(0) to SWc(6) are turned on, Rx=$\gamma$/10.

When writing "1" into the EPROM (0) to EPROM (4) of five bits too, Rx=$\gamma$/10, the same as when writing "1" into the EPROM (0) to EPROM (2) of three bits. Therefore, regardless of the number of bits of which the EPROM (0) to EPROM (n) are written into, Rx is constant, and the writing voltage 2 is as in the following Equation 4.

$$\text{Writing voltage 2} = Rx/(Rx+Ry) \times \text{writing voltage 1} \quad (4)$$

As in Equation 4 above, Rx is constant at $\gamma$/10, regardless of the bit number. Because of this, even when Ry is a constant resistance, the writing voltage 2 is always constant at Rx/(Rx+Ry) times the writing voltage 1.

At this time, when Rx=Ry, the writing voltage 2 is one-half of the writing voltage 1, while when Rx=3×Ry, it is possible for the writing voltage 2 to be three-fourths of the writing voltage 1.

That is, the writing voltage 2 can be arranged to be any constant voltage owing to the relationship between Rx and Ry, regardless of the number of bits written into. Also, as the writing terminals of the writing voltage 1 and writing voltage 2 are commonized, the number of terminals is reduced, and furthermore, as it is possible to manufacture an active element and passive element on the same semiconductor chip using a CMOS manufacturing process, it is possible to reduce manufacturing cost.

Provided that the invention is a semiconductor integrated circuit including an EPROM for regulating another analog circuit, the invention can be applied in the same way, and the same advantages can be achieved, regardless of the semiconductor physical quantity sensor device. Consequently, according to Embodiment 2, by including the auxiliary memory circuit 12, main memory circuit 13, a signal distinguishing means 17, constant resistance 20, GND terminal 21, Vcc terminal 22, DS terminal 23, and CG/CLK terminal 25, as heretofore described, it is possible to obtain the same advantages as in Embodiment 1.

Embodiment 3

Figure 6:
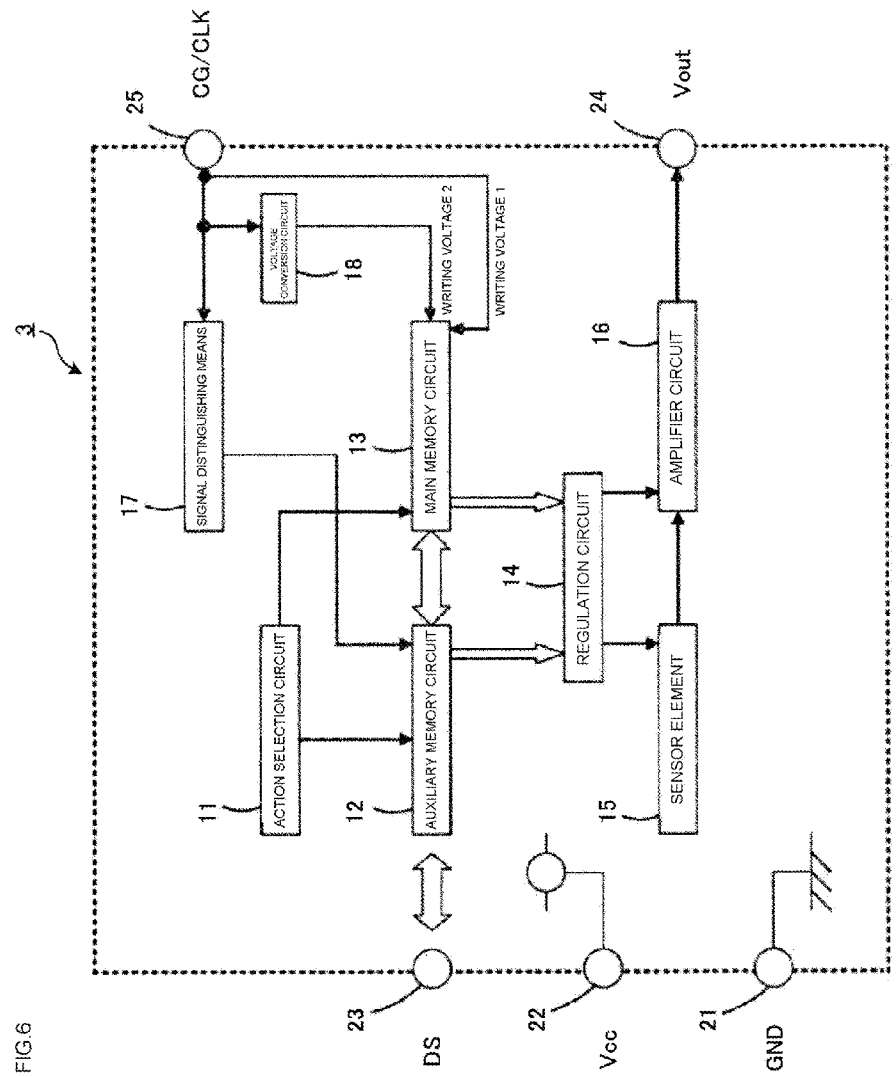
FIG. 6 is a block diagram showing a configuration of a semiconductor physical quantity sensor device according to Embodiment 3 of the invention.

FIG. 6 is a block diagram showing a configuration of a semiconductor physical quantity sensor device according to Embodiment 3 of the invention. A difference between the semiconductor physical quantity sensor device 3 according to Embodiment 3 of the invention of FIG. 6 and the heretofore known semiconductor physical quantity sensor device 5 of FIG. 10 is that the circuit configuration of the voltage conversion circuit 18a of the heretofore known semiconductor physical quantity sensor device 5 is replaced with the circuit configuration of a voltage conversion circuit 18 of FIG. 7. The configuration of the main memory circuit 13 is the same as that of the main memory circuit of Embodiment 1.

The semiconductor physical quantity sensor device 3 of FIG. 6 includes, for example, the action selection circuit 11, the auxiliary memory circuit 12, the main memory circuit 13, the regulation circuit 14, the sensor element 15, such as a Wheatstone bridge, the amplifier circuit 16, the signal distinguishing means 17, the voltage conversion circuit 18, and the five terminals 21 to 25, from the first to the fifth.

A description will be given of a write action when using the EPROM(0) to EPROM(n) for the main memory circuit 13 and using a shift register for the auxiliary memory circuit 12. The memory circuit including the main memory circuit 13 and auxiliary memory circuit 12 of FIG. 6 is the same as the memory circuit shown in FIG. 2.

As previously described, data are input into the auxiliary memory circuit 12, which is formed of a shift register, by data being input from the DS terminal and a clock signal being input from the CG/CLK terminal. The switches SWa(0) to SWa(n) are turned on and off in accordance with the flip-flop outputs Q0 to Qn in the shift register. For example, as the gate voltage of the switch Swa(1) is "L (0V)" when the output Q1 is "H", the switch Swa(1) is turned on. Conversely, as the gate voltage of the switch Swa(1) is "H (5V)" when Q1 is "L", the switch Swa(1) is turned off. When arranging so that the switches SWa(0) to SWa(n) are turned on when the flip-flop outputs Q0 to Qn are "L", either a configuration is such that no inversion circuit is provided in the auxiliary memory circuit 12, or a configuration is such that further inversion circuits are added.

When the writing voltage 1 and writing voltage 2 are applied to the main memory circuit 13 in a state in which data have entered the shift register in this way, current flows through the EPROMs, of the EPROM(0) to EPROM(n), of the bits of which the switches SWa(0) to SWa(n) are turned on. Further, a charge is trapped in the floating gates of the EPROMs of the bits of which the switches SWa(0) to SWa(n) are turned on due to an electric field caused by the writing voltage 1.

In an EPROM in whose floating gate a charge is trapped, the threshold voltage rises. Voltage applied to the control gate of an EPROM when data written into the EPROM are retrieved is set so as to be, for example, a voltage in the region of 4V, generated by dividing the power source voltage. Because of this, an EPROM in whose floating gate no charge is trapped is turned into an on-state simply by a voltage in the region of 4V being applied to the control gate. Meanwhile, as the threshold voltage has risen, an EPROM in whose floating gate a charge is trapped is not turned on by a voltage in the region of 4V, and is thus in an off-state. When retrieving data written into the EPROM(0) to EPROM(n), all the switches SWa(0) to SWa(n) are controlled so as to be in an off-state (not shown).

Because of this, the drain voltages Data(0) to Data(n) of the EPROM(0) to EPROM(n) respectively become the GND potential or floating potential. By each of the drain voltages Data(0) to Data(n) being pulled up by a resistor to the power source voltage (5V), the drain voltages Data(0) to Data(n) are fixed at 0V or 5V (not shown).

Figure 7:
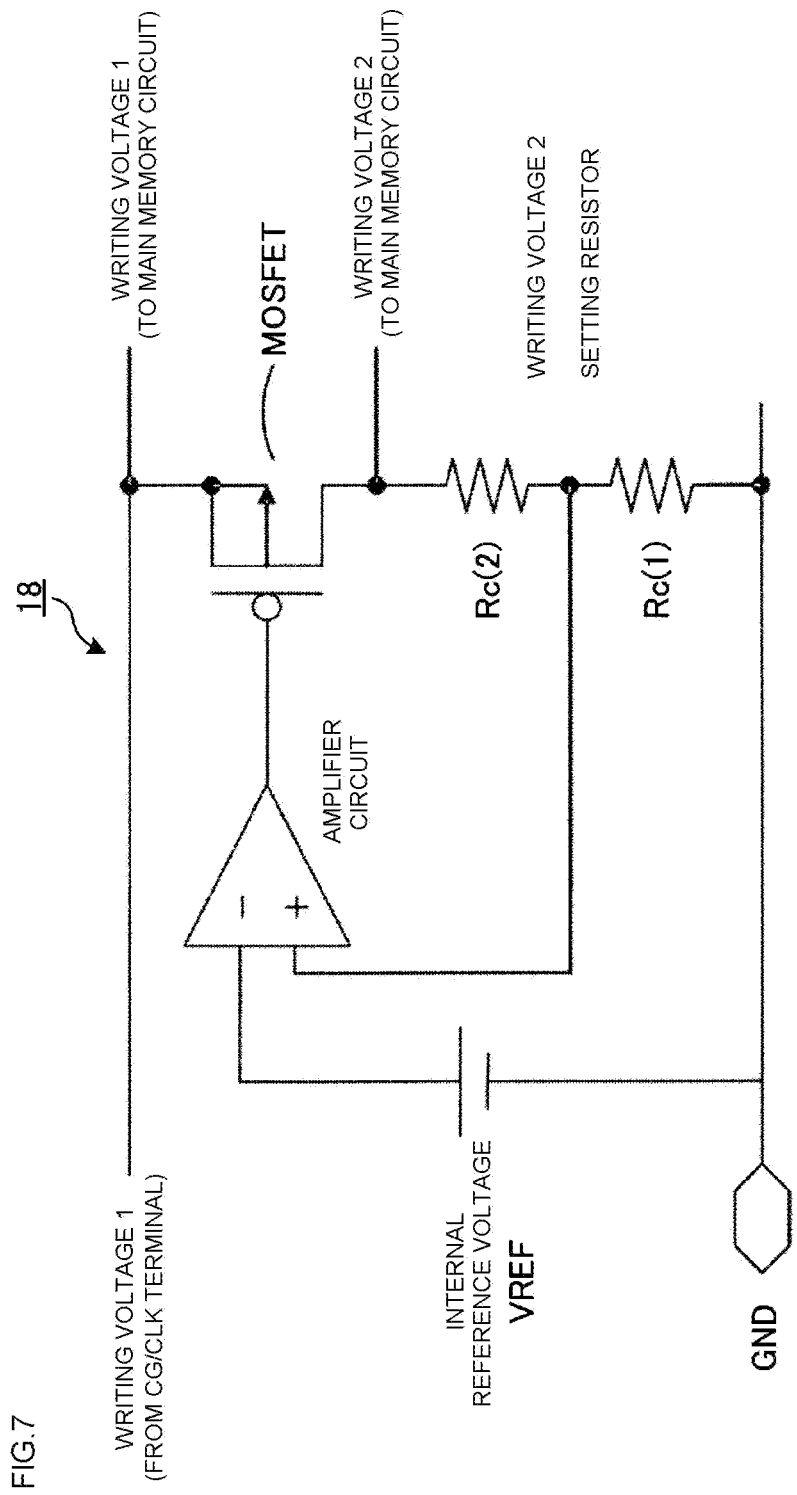
FIG. 7 is a circuit diagram showing in detail a voltage conversion circuit of FIG. 6.

The values of the drain voltages Data(0) to Data(n) are input into the regulation circuit 14, and the characteristics are regulated by the sensor element 15 and amplifier circuit 16. FIG. 7 is a circuit diagram showing in detail the voltage conversion circuit of FIG. 6. FIG. 7 shows a configuration of the voltage conversion circuit 18 of FIG. 6 for forming the writing voltage 2 from the writing voltage 1.

In FIG. 7, a MOSFET is provided between the writing voltage 1 and writing voltage 2. The writing voltage 2 divided by resistors Rc(1) and Rc(2) for setting the writing voltage 2 (=Rc(1)/(Rc(1)+Rc (2))×writing voltage 2) is input into the non-inverted input terminal of the amplifier circuit, and an internal reference voltage VREF formed from power source voltage VCC (not shown) is input into the inverted input terminal of the amplifier circuit. The output of the amplifier circuit is input into the MOSFET provided between the writing voltage 1 and writing voltage 2. Because of this, the gate voltage of the MOSFET is determined so that the writing voltage 2 is as in the following Equation (5).

$$\text{Writing voltage } 2=(Rc(2)+Rc(1))/Rc(1)\times VREF \quad (5)$$

When using the voltage conversion circuit 18, the on-state resistance of the MOSFET changes owing to the gate voltage of the MOSFET changing so that the writing voltage 2 becomes a predetermined voltage, even in the event that the load resistance of the writing voltage 2 changes due to a change in the number of bits of which the EPROM(0) to EPROM(n) are written into.

Therefore, even in the event of a change in the number of bits of which the EPROM(0) to EPROM(n) are written into, the writing voltage 2 becomes the predetermined voltage. Consequently, according to Embodiment 3, it is possible to obtain the same advantages as in Embodiment 1.

Embodiment 4

Figure 8:
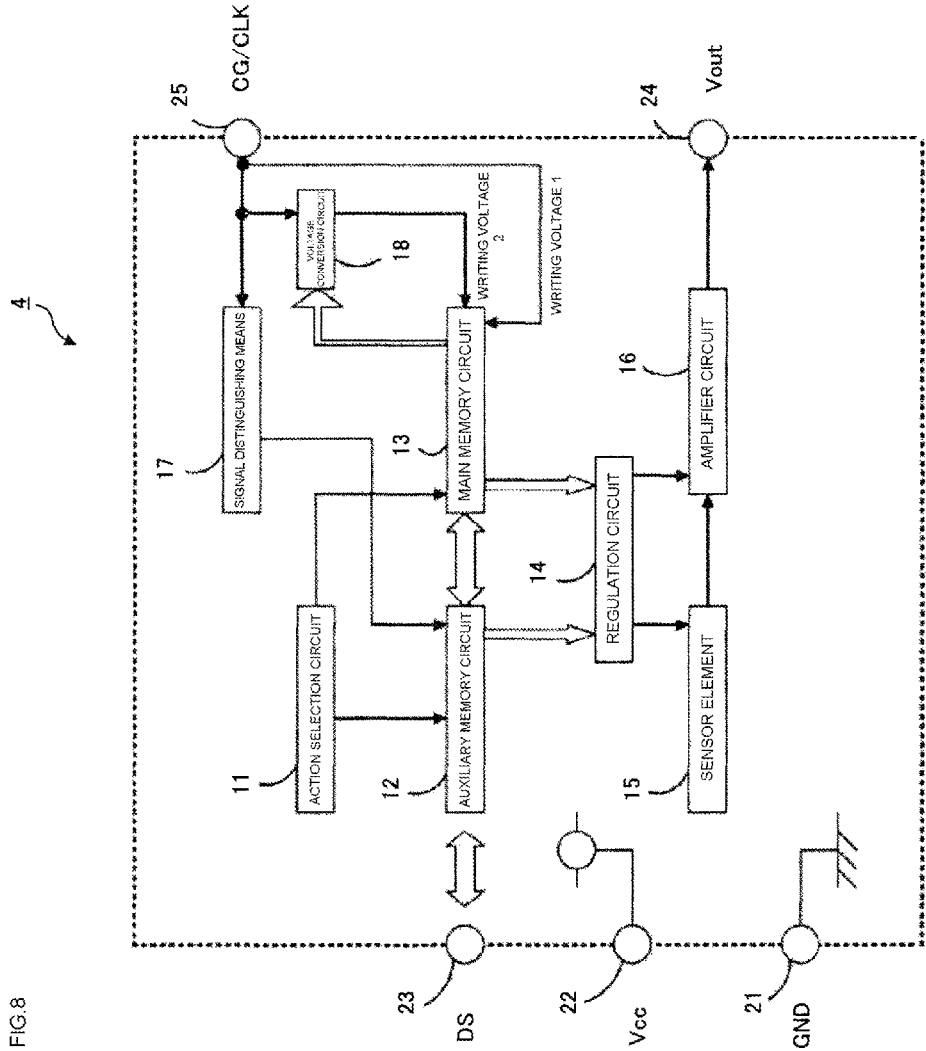
FIG. 8 is a block diagram showing a configuration of a semiconductor physical quantity sensor device according to Embodiment 4 of the invention.

FIG. 8 is a block diagram showing a configuration of a semiconductor physical quantity sensor device according to Embodiment 4 of the invention. A difference between the semiconductor physical quantity sensor device 4 according to Embodiment 4 of the invention of FIG. 8 and the heretofore known semiconductor physical quantity sensor device 5 of FIG. 10 is that the circuit configuration of the voltage conversion circuit 18a of the heretofore known semiconductor physical quantity sensor device 5 is replaced with the circuit configuration of the voltage conversion circuit 18 of FIG. 9. The configuration of the main memory circuit 13 is the same as that of the main memory circuit of Embodiment 1.

The semiconductor physical quantity sensor device 4 includes the action selection circuit 11, the auxiliary memory circuit 12, the main memory circuit 13, the regulation circuit 14, the sensor element 15, such as a Wheatstone bridge, the amplifier circuit 16, the signal distinguishing means 17, the voltage conversion circuit 18, and the five terminals 21 to 25, from the first to the fifth.

Figure 9:
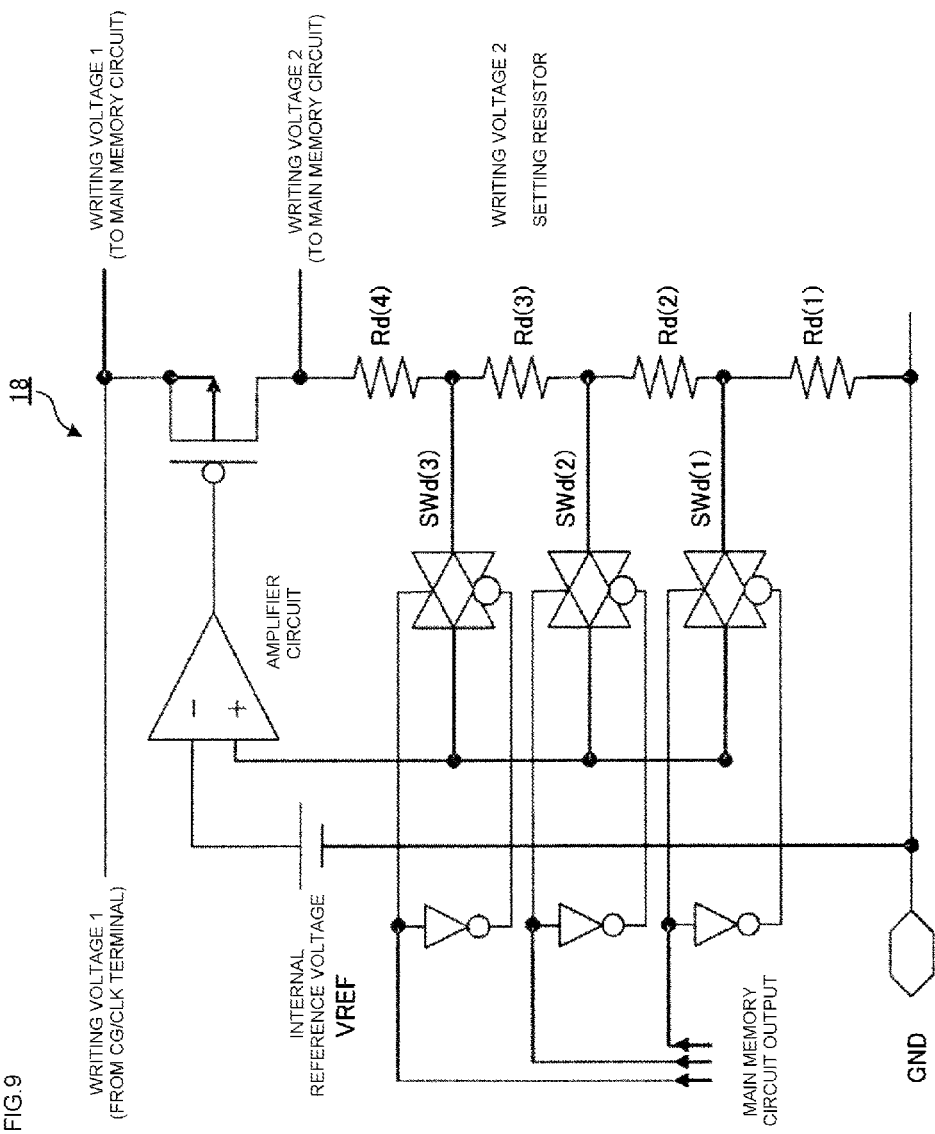
FIG. 9 is a circuit diagram showing in detail a voltage conversion circuit of FIG. 8.

FIG. 9 is a circuit diagram showing in detail the voltage conversion circuit 18 of FIG. 8. FIG. 9 shows a configuration of the voltage conversion circuit 18 of FIG. 8 for forming the writing voltage 2 from the writing voltage 1. The voltage input into the forward input terminal of the amplifier circuit inside the voltage conversion circuit 18 is such that a plurality of writing voltages can be set by providing switches SWd(1) to SWd(3) so that it is possible to select boundary locations of writing voltage 2 setting resistors Rd(1) to Rd(4) from two or more locations, and the on/off of the switches SWd(1) to SWd(3) being selectable in accordance with the output of the auxiliary memory circuit 12.

In Embodiments 1 to 4, the switch SWa(m), switch SWb (m), and switch SWc(m) are all shown as p-channel MOSFETs, but at least one portion may have another configuration, such as a transmission gate formed of an n-channel MOS, or p-channel MOSFET and n-channel MOSFET, or the like. In this case, inversion channels are provided as necessary. For example, a case wherein n-channel MOSFETs are used instead of p-channel MOSFETs for all of the switch SWa(m), switch SWb(m), and switch SWc(m) will be considered. In this case, this can be achieved in the memory circuit and variable resistance circuit 19 shown in FIG. 2 and FIG. 3 by adopting a configuration such that no inversion circuit is provided, or further inversion circuits are added and provided, between the shift register and switch SWa(m) and between the shift register and switch SWb(m). Also, this can be achieved in the memory circuit shown in FIG. 5 by no inversion circuit being provided, or further inversion circuits being added and provided, between the shift register and switch SWa(m), and by an inversion circuit being inserted between the shift register and switch SWc(m).

INDUSTRIAL APPLICABILITY

As heretofore described, the semiconductor integrated circuit according to the invention relates to a semiconductor integrated circuit including a memory circuit, and in particular, is useful as a semiconductor integrated circuit including a configuration that regulates the characteristics of an analog circuit by electrical trimming using an EPROM. Also, the semiconductor physical quantity sensor device according to the invention is useful as a semiconductor physical quantity sensor device that carries out, by electrical trimming using an EPROM, sensitivity regulation, temperature characteristic regulation, and offset regulation of a semiconductor physical quantity sensor, such as a pressure sensor or acceleration sensor, used in various kinds of device, and the like, for vehicle use, medical use, industrial use, and the like.

The invention claimed is:

1. A semiconductor integrated circuit, comprising:
a data input terminal that inputs serial digital data;
a ground terminal that supplies ground potential;
a power source terminal that supplies power source voltage;
an auxiliary memory circuit that temporarily stores trimming data input from the data input terminal;
a programmable read only main memory circuit that stores trimming data stored in the auxiliary memory circuit using an electrical rewrite action;
a writing terminal that inputs an external clock, or that supplies a first writing voltage, equal to or higher than the power source voltage, for writing data into the main memory circuit;
a constant resistance circuit that, based on the first writing voltage input from the writing terminal, generates a second writing voltage, which is equal to or higher than the power source voltage and wherein the first writing voltage is divided by resistance of the main memory circuit, for writing data into the main memory circuit, and supplies the second writing voltage to the main memory circuit; and
a signal distinguishing means that determines whether voltage applied to the writing terminal is an external clock, or whether it is the first writing voltage, supplies the external clock to the auxiliary memory circuit, and supplies the first writing voltage to the main memory circuit, wherein
the auxiliary memory circuit is configured of a shift register wherein a plurality of flip-flops are cascade connected,
the main memory circuit includes a first series circuit, corresponding to each flip-flop, formed of a first switch and an EPROM connected in series to the first switch and driven by the first writing voltage, and a second series circuit, corresponding to each flip-flop, formed of a second switch and a resistor connected in series to the second switch,
a plurality of the first series circuits and a plurality of the second series circuits are connected in parallel,
a plurality of the first series circuits and plurality of the second series circuits and the constant resistance circuit are connected in series, and
when the first writing voltage is applied, the first series circuit and second series circuit corresponding to the same flip-flop are such that when the first switch is turned on, the second switch is turned off, while when the first switch is turned off, the second switch is turned on.

2. The semiconductor integrated circuit according to claim 1, wherein
the first switch and second switch are formed of p-channel MOSFETs, and
when the first writing voltage is applied, the turning on and off of the first switch of the first series circuit corresponding to a certain flip-flop is controlled based on the output of the flip-flop, and the turning on and off of the second switch of the second series circuit corresponding to a certain flip-flop is controlled based on the output of the flip-flop.

3. A semiconductor physical quantity sensor device, comprising:
a sensor element that generates an electrical signal in accordance with a detected physical quantity;
an output terminal that outputs the electrical signal generated by the sensor element to the exterior;
a data input terminal that inputs serial digital data, which form trimming data for regulating the output characteristics of the sensor element;
a ground terminal that supplies ground potential;
a power source terminal that supplies power source voltage;
an auxiliary memory circuit that temporarily stores trimming data input from the data input terminal;
a programmable read only main memory circuit that stores trimming data stored in the auxiliary memory circuit using an electrical rewrite action;
a writing terminal that inputs an external clock, or that supplies a first writing voltage, equal to or higher than the power source voltage, for writing data into the main memory circuit;
a constant resistance circuit that, based on the first writing voltage input from the writing terminal, generates a second writing voltage, which is equal to or higher than the power source voltage and wherein the first writing voltage is divided by resistance of the main memory circuit, for writing data into the main memory circuit, and supplies the second writing voltage to the main memory circuit;
an action selection circuit that controls an action of the auxiliary memory circuit and main memory circuit based on one portion of digital data stored in the auxiliary memory circuit;
a signal distinguishing means that determines whether voltage applied to the writing terminal is an external clock, or whether it is the first writing voltage, supplies the external clock to the auxiliary memory circuit, and supplies the first writing voltage to the main memory circuit; and a regulation circuit that regulates the output characteristics of the sensor element based on trimming data stored in the auxiliary memory circuit or trimming data stored in the main memory circuit, wherein the auxiliary memory circuit is configured of a shift register wherein a plurality of flip-flops are cascade connected, the main memory circuit includes a first series circuit, corresponding to each flip-flop, formed of a first switch and an EPROM connected in series to the first switch and driven by the first writing voltage, and a second series circuit, corresponding to each flip-flop, formed of a second switch and a resistor connected in series to the second switch, a plurality of the first series circuits and a plurality of the second series circuits are connected in parallel, a plurality of the first series circuits and plurality of the second series circuits and the constant resistance circuit are connected in series, and when the first writing voltage is applied, the first series circuit and second series circuit corresponding to the same flip-flop are such that when the first switch is turned on, the second switch is turned off, while when the first switch is turned off, the second switch is turned on.

4. The semiconductor physical quantity sensor device according to claim 3, wherein the first switch and second switch are formed of p-channel MOSFETs, and when the first writing voltage is applied, the turning on and off of the first switch of the first series circuit corresponding to a certain flip-flop is controlled based on the output of the flip-flop, and the turning on and off of the second switch of the second series circuit corresponding to a certain flip-flop is controlled based on the output of the flip-flop.

5. The semiconductor physical quantity sensor device according to claim 4, the semiconductor physical quantity sensor device consisting of only an active element and a passive element, formed on the same semiconductor chip, manufactured by a CMOS manufacturing process.

6. The semiconductor physical quantity sensor device according to claim 3, the semiconductor physical quantity sensor device consisting of only an active element and a passive element, formed on the same semiconductor chip, manufactured by a CMOS manufacturing process.

* * * * *